United States Patent [19]

Moraveji

[11] Patent Number: 5,399,991
[45] Date of Patent: Mar. 21, 1995

[54] HIGH SPEED LOW POWER OP-AMP CIRCUIT

[75] Inventor: Farhood Moraveji, Campbell, Calif.

[73] Assignee: National Semiconductor Corporation, Santa Clara, Calif.

[21] Appl. No.: 270,524

[22] Filed: Jul. 5, 1994

Related U.S. Application Data

[63] Continuation of Ser. No. 10,379, Jan. 28, 1993, abandoned.

[51] Int. Cl.⁶ ............................................. H03F 3/45
[52] U.S. Cl. ..................................... 330/255; 332/257; 332/311
[58] Field of Search ............... 330/255, 257, 311, 275, 330/301

[56] References Cited

U.S. PATENT DOCUMENTS

| | | | |
|---|---|---|---|
| 3,673,508 | 6/1972 | Callahan, Jr. | 330/257 |
| 3,927,333 | 12/1975 | Euruhashi | 330/263 X |
| 4,377,789 | 3/1983 | Hoover | 330/257 X |
| 4,532,479 | 7/1985 | Blauschild | 330/257 X |
| 4,797,631 | 1/1989 | Hsu et al. | 330/255 X |

FOREIGN PATENT DOCUMENTS 1264302 10/1986 U.S.S.R. ............... 330/255

*Primary Examiner*—James B. Mullins
*Attorney, Agent, or Firm*—H. Donald Nelson; Brian D. Ogonowsky; Vincenzo D. Pitruzzella

[57] ABSTRACT

A high speed operational amplifier includes a differential amplifier input stage capable of producing a pair of complementary differential outputs. Complementary current mirrors receive the differential signals out of the first stage and combine them at a common output node for amplification by an output buffer. The circuit can be operated at low power and produces a high slew rate.

5 Claims, 4 Drawing Sheets

HIGH SPEED LOW POWER OP-AMP CIRCUIT

This application is a continuation of application Ser. No. 08/010,379, filed Jan. 28, 1993, now abandoned.

BACKGROUND OF THE INVENTION

The invention is to be applied to an integrated circuit (IC) operational amplifier (op-amp) which is intended for operation at low power and a high slew rate (speed). Typically, such devices are programmable by the user who can, by selecting suitable external components, set the electrical characteristics of the circuit. By operating the op-amp at a higher current the user can increase its speed and transconductance. However, when lower values are acceptable, a lower operating current can be tolerated, the power consumption and dissipation can be lowered. This gives the user a greater design latitude in the form of programmability.

PRIOR ART

FIG. 1 is a simplified schematic diagram of the well-known LM3080 op-amp. The circuit operates from a $+V_{CC}$ power supply connected + to terminal 10 and − to terminal 11. Terminal 12 is the output of the op-amp while terminals 13 and 14 are the noninverting and inverting inputs respectively. The input stage is composed of differentially operated transistors 15 and 16, which form a so-called long-tail pair, with transistor 17 providing the tail current. The bias applied to terminal 18 will program the desired tail current. In general, three high accuracy Wilson current mirrors, 19–21, are connected to drive output terminal 12. Mirrors 19 and 20 reflect the current in transistor 16 which will act to sink current at terminal 12. Mirror 21 reflects the current in transistor 15 to output terminal 12 and thereby sources current to the output. The circuit transconductance is substantially that of the input stage which is typically about 10000 micromhos for a 5 microampere tail current. At this bias level, the slew rate is about 50 V/microsecond and the peak output current about 0.5 milliampere.

In the evolution of IC design it is always desirable to increase circuit performance. Higher speed and lower current drain are always design goals to be pursued. The present invention provides such an improvement.

SUMMARY OF THE INVENTION

It is an object of the invention to provide an op-amp that operates at increased speed and at low supply currents.

It is a further object of the invention to provide a programmable IC having increased speed and low current drain.

These and other objects are achieved in a circuit configured as follows. A differential input stage is coupled to drive a pair of current mirrors differentially and each one is driven in push-pull fashion. The pair of current mirrors have their outputs commonly coupled to the circuit output node which displays a high slew rate. The currents in the input stage and the current mirrors are controlled by a common constant current element which programs transconductance. This element can be made an off-chip element for user programming.

DESCRIPTION OF THE INVENTION

Figure 1:
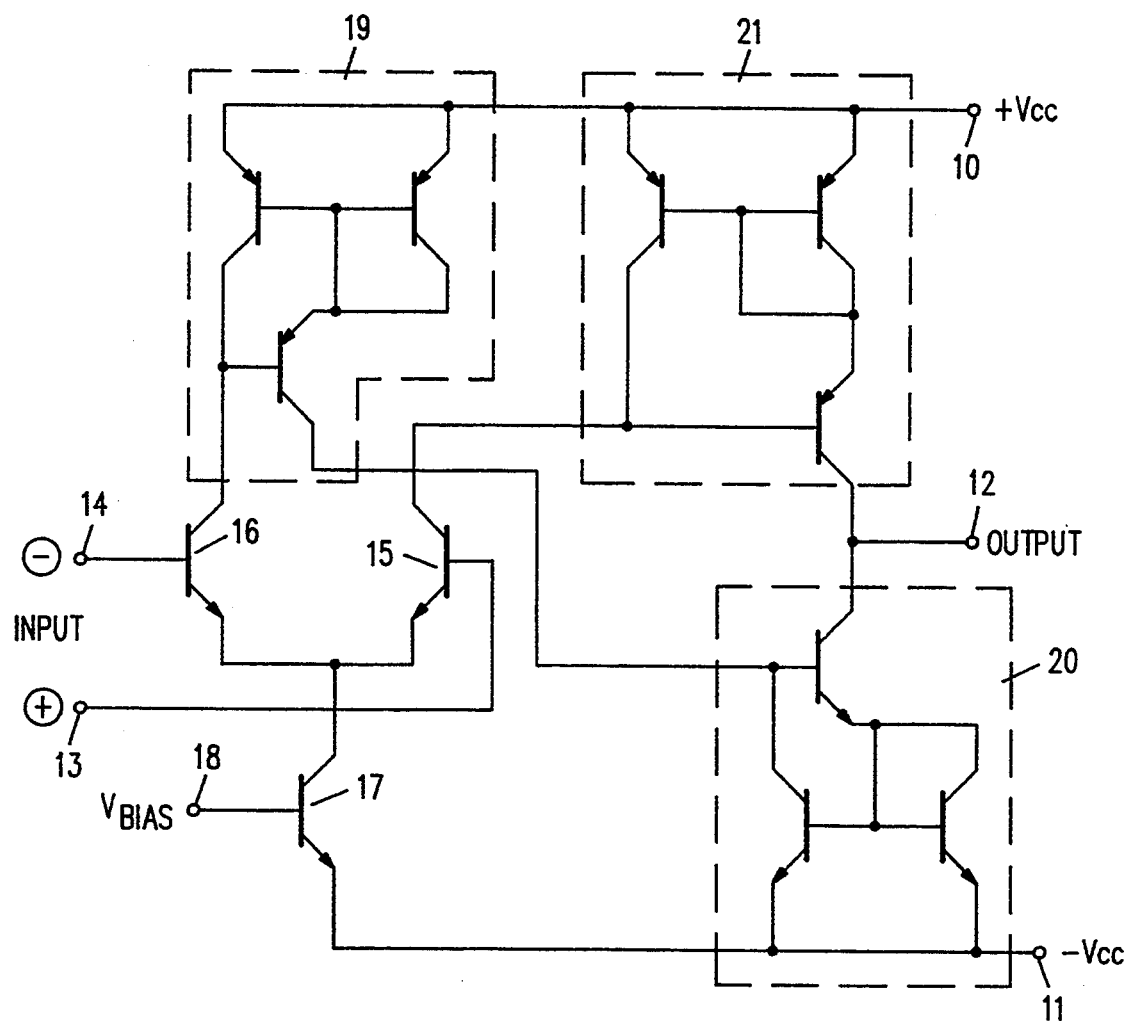
FIG. 1 is a simplified schematic diagram of the prior art.
Figure 2:
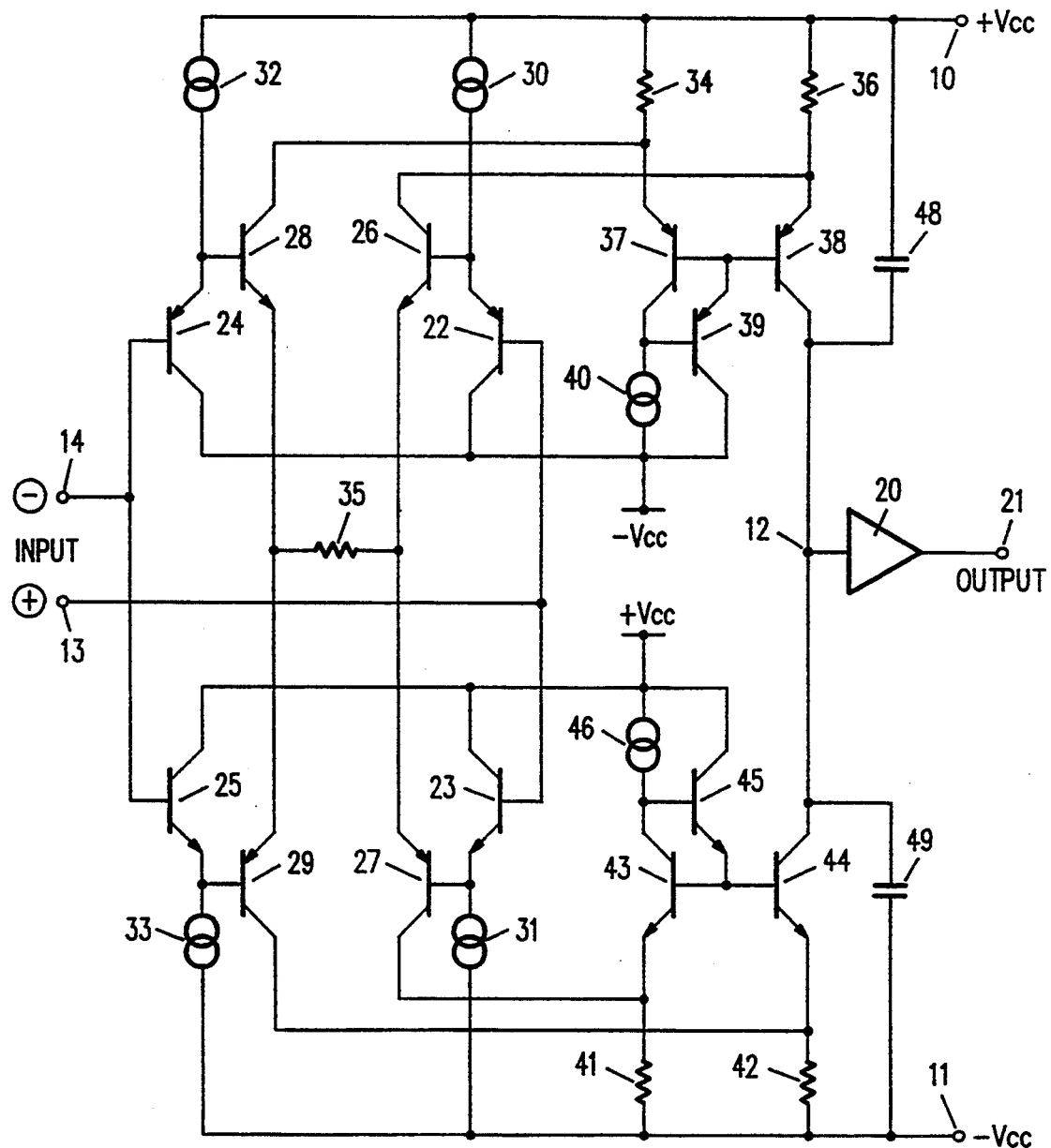
FIG. 2 is a simplified diagram of the basic circuit of the invention.

With reference to FIG. 2, where the elements are similar to those of FIG. 1, the same designations are used. Output node 12 is coupled to the input of a buffer 20 which acts to amplify the signal and to isolate the output load terminal 21 from node 12.

The circuit input stage is composed of transistors 22 through 29. Transistors 22 through 25 are operated as emitter followers having respective constant current load elements 30 through 33. Transistors 26 and 27 are coupled as emitter followers to drive the right-hand end of resistor 35, which is a relatively low value resistor. Transistors 28 and 29 are similarly coupled to drive the left-hand end of resistor 35. Thus, each end of resistor 35 is driven from a pair of cascaded complementary emitter followers from input terminals 13 and 14. Such cascaded emitter followers produce close to unity voltage gain with close to zero offset so that whatever input potential differential is applied at terminals 13 and 14 will appear across resistor 35. Since the emitter followers display substantial current gain the low value of resistor 35 appears as a relatively large impedance looking into terminals 13 and 14. The current flowing in resistor 35 is equal to the differential input voltage divided by the value of resistor 35. Thus, the differential input voltage is converted into a current and the input stage displays a very large transconductance.

The collectors of transistors 26 and 28 are coupled to resistor 34 and 36 which share a super diode-current mirror composed of transistors 37–39. Transistor 39 forces transistor 37 to function as a diode which conducts a current determined by constant current sink 40. Thus, transistor 38 sources a constant current into node 12.

Likewise, transistors 27 and 29 are coupled to resistors 41 and 42 which share a second, complementary, super-diode current mirror composed of transistors 43–45. Transistor 45 forces transistor 43 to operate as a diode and constant current source 46 passes its current through transistor 43. Accordingly, transistor 44 sinks a constant current from node 12. If sink 40 is matched to source 46, node 12 will assume a quiescent potential half way between + and − $V_{CC}$ terminals 10 and 11. This will occur if the super-diode current mirror components are properly matched along with resistors 34, 36, 41 and 42.

If a differential input is present at terminals 13 and 14, a current will flow in resistor 35 with a polarity determined by the signal polarity. For example, if terminal 13 is positive with respect to terminal 14 current will flow from right to left in resistor 35 and the emitter of transistor 26 will be higher than the emitter of transistor 28. Transistors 26 and 28 will magnify this differential input voltage operating as common base amplifiers. Thus, the emitter of transistor 38 will be higher than the emitter of transistor 37. This is a push-pull signal drive at the emitters of transistors 38 and 37. The voltage variation at the collector of transistor 37 is coupled via transistor 39 to the base of transistor 38, which is voltage driven in push-pull fashion. The collector of transistor 38 then varies to represent a single-ended current mirror voltage output that is applied to node 12.

A similar complementary signal transfer takes place in the lower half of the circuit. However, since the lower half is a complement of the upper half, the signal assumes the opposite polarity. Thus, as transistor 38 pulls node 12 up, transistor 44 is driven from the push-pull emitter-base drive to push node 12 up.

Capacitor 48, which is connected from node 12 to $+V_{CC}$, operates in conjunction with capacitor 49, which is connected between node 12 and $-V_{CC}$, to frequency compensate the circuit. From a signal standpoint, equal value capacitors 48 and 49 are in parallel.

In summary, the transistor mirror currents are substantially constant. The input stage varies the currents flowing in resistors 34, 36, 41 and 42, so that the push-pull drives vary the output voltage in proportion to the differential signal applied to the input stage input terminals. Since the input stage involves cascaded emitter follower transistors the transconductance is quite large.

Figure 3A:
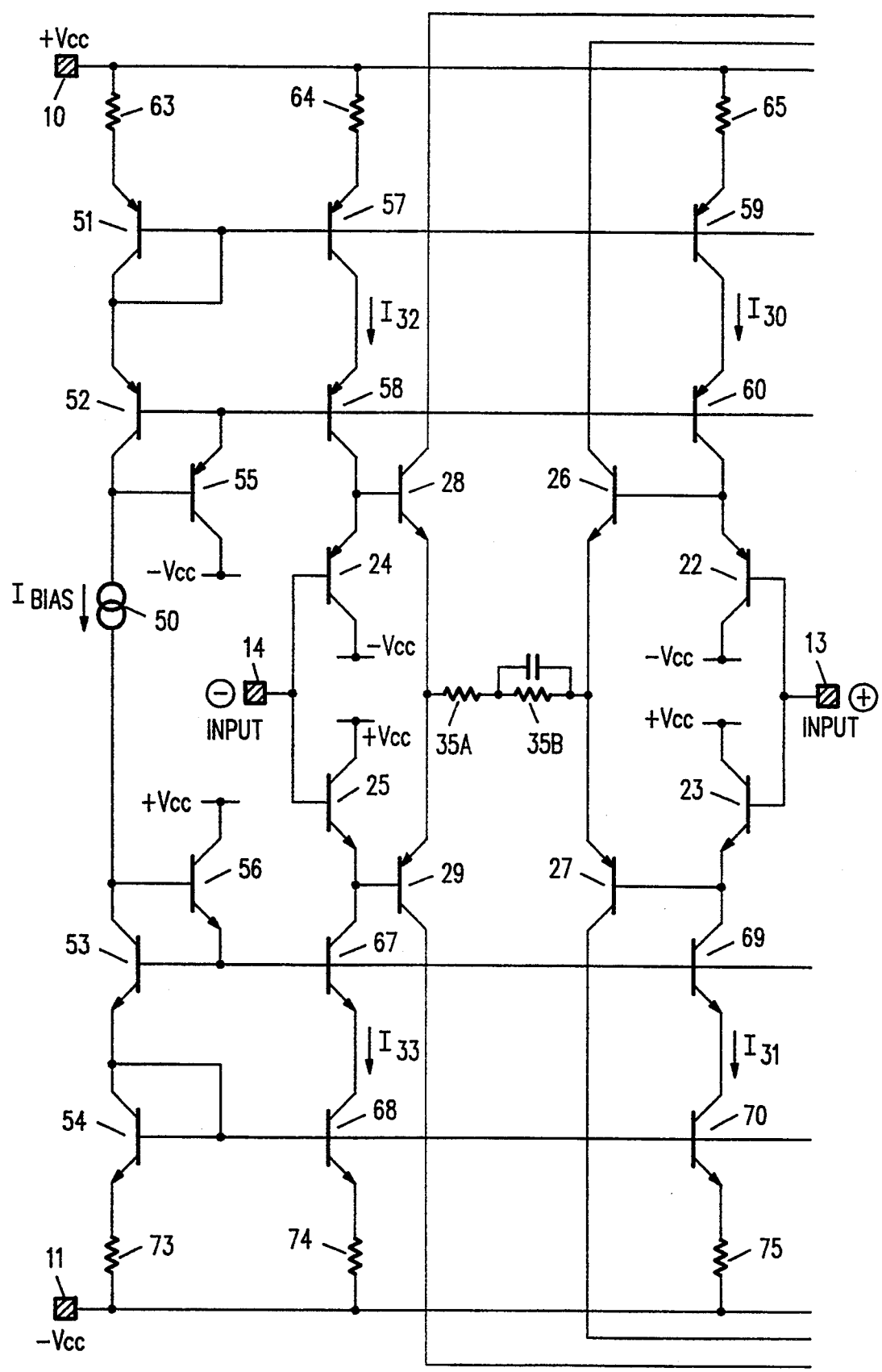
FIGS. 3A and 3B together form a more detailed schematic diagram of the preferred embodiment of the invention.
Figure 3B:
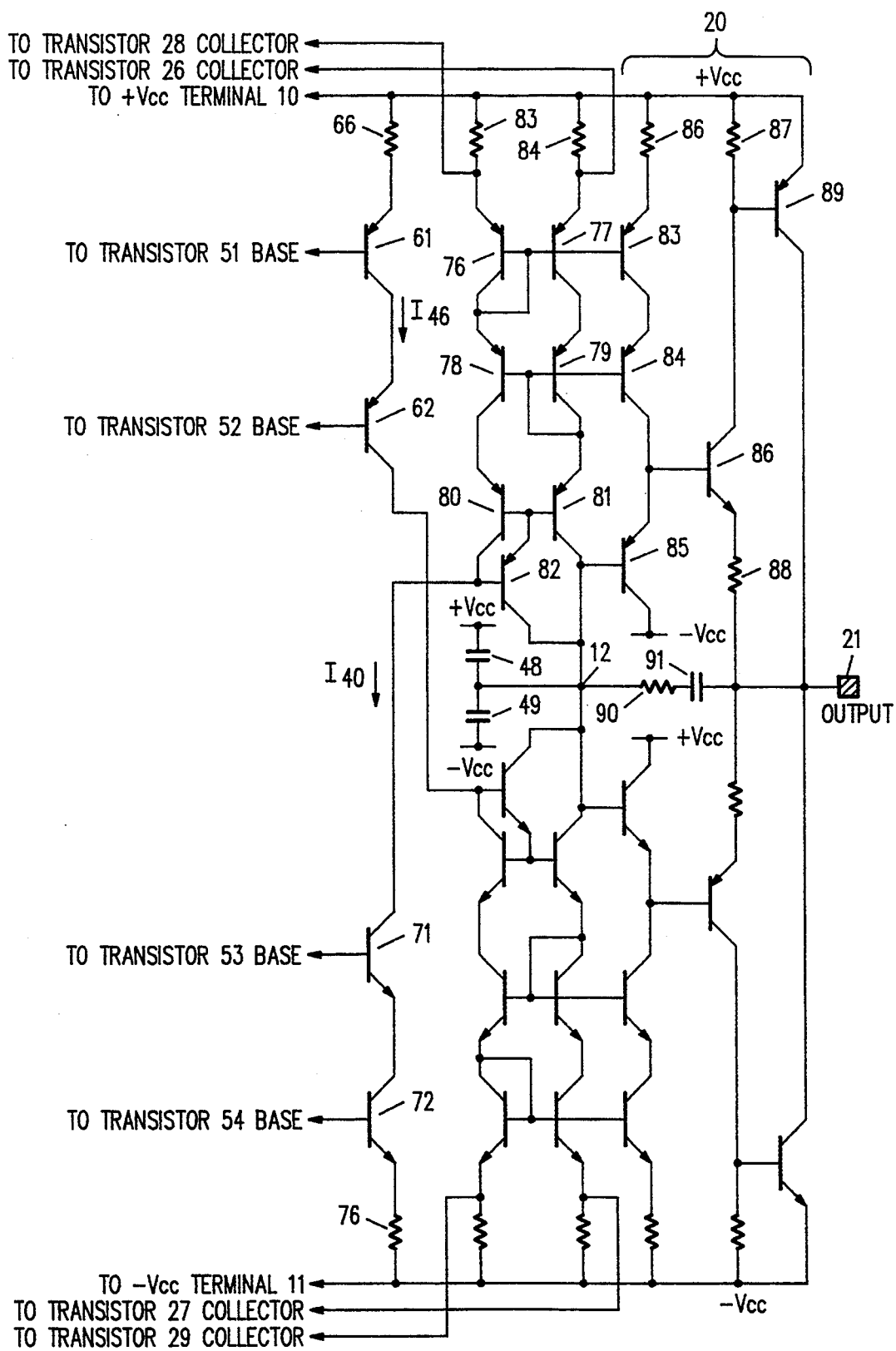

FIGS. 3A and 3B, together, form a more detailed schematic diagram of the circuit of the preferred embodiment of the invention. Where the parts are the same as those of FIG. 2, the same designations are used.

Current source 32 of FIG. 2, which passes $I_{32}$, is composed of cascode-connected transistors 57 and 58 with the collector of transistor 58 providing the output. Resistor 64 degenerates transistor 57. The transistor bias potentials are developed from a current mirror input leg which passes the current produced by a constant current element 50 which produces $I_{BIAS}$. Transistors 51 and 52 carry $I_{BIAS}$ and are cascode connected. Resistor 63 degenerates transistor 51 which biases transistor 57. Transistor 55, operating with transistor 52 creates a super-diode which biases transistor 58. Thus, $I_{BIAS}$ is reflected as $I_{32}$.

$I_{BIAS}$ also flows in transistor 53 and 54, which are cascode connected to bias transistors 67 and 68 which sink $I_{33}$. Resistors 73 and 74, respectively, degenerate transistors 54 and 68. Transistor 54 is diode connected and transistor 56 forces transistor 53 to operate as a super-diode. Thus, $I_{33}$ is also a current mirror reflection of $I_{BIAS}$. While not shown, constant current element 50 can be made an off-chip device so that the user can program $I_{BIAS}$. This will allow the user to control the transconductance of the circuit and, hence, the overall circuit gain.

In a similar fashion, transistors 59 and 60 develop $I_{30}$ as a reflection of $I_{BIAS}$ and transistors 69 and 70 reflect $I_{31}$. As seen in FIG. 3B, $I_{46}$ is developed by transistors 61 and 62, while $I_{40}$ is developed by transistors 71 and 72. Both of these currents are also current mirror reflections of $I_{BIAS}$.

The push-pull driven current mirrors, which are shown in simplified form in FIG. 2, are seen in FIG. 3B as cascode connected current mirrors which are driven by $I_{46}$ for the upper mirror and $I_{40}$ for the lower mirror. These two mirrors have their outputs joined in common at node 12.

Transistors 76–82 form a cascoded current mirror which includes input resistor 83 and 84. Transistors 76 and 79 are diode connected and transistor 82 forces transistor 80 to function as a diode. $I_{40}$ flows in transistors 76, 78 and 80, which, in turn, bias transistors 77, 79 and 81 so that a mirrored current flows therein. It can be seen that resistor 83 will be directly coupled to transistor 28. Likewise, transistor 26 is directly coupled to transistor 77 by way of shared resistor 84. The collectors of transistors 81 and 82 form the single-ended output of the push-pull input current mirror at node 12.

The lower current mirror, which also complementarily drives node 12, is a mirror image complement of the upper mirror and is push-pull driven by the collectors of transistors 27 and 29.

Buffer 20, in FIG. 2, is shown as a block. In FIG. 3B it is detailed as a three stage noninverting amplifier. Transistors 83–85 form the input stage of buffer 20. They are biased and driven by the cascoded current mirror. Transistor 83 is driven in parallel with transistor 77 by transistor 76 and is degenerated by resistor 86.

Transistor 84 is driven by transistor 79 and transistor 85 is driven by the current mirror output node 12. The input stage current will also be a reflection of the current mirror input $I_{40}$. The second stage of buffer 20 is transistor 86, which has its collector directly coupled to the base of output transistor 89 (the third stage). Resistor 87 forms the load for transistor 86. The emitter of transistor 86 is returned to output terminal 21 by way of low value resistor 88 which acts as a degeneration element. Transistor 89 is a common emitter output stage and is bootstrap driven by common emitter transistor 86. Since the input stage is an emitter follower and both transistors 86 and 89 produce signal inversions, buffer 20 is noninverting and capable of substantial voltage and current gain. The lower half of buffer 20 is a complementary mirror image of the upper half, thereby forming a complementary amplifier circuit. Resistor 90 and capacitor 91 provide a conventional frequency compensation feedback around buffer 20.

The circuit of FIGS. 3A and 3B display substantial programmable transconductance, can be operated at low current and displays a large slew rate.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. An operational amplifier circuit comprising:
   an input stage configured to receive a differential input signal and providing a differential output, said input stage comprising:
   cascaded first and second emitter follower transistors and cascaded third and fourth emitter follower transistors, said input stage having a first input terminal connected to a base of said first emitter follower transistor, and having a second input terminal connected to a base of said third emitter follower transistor, wherein said first emitter follower transistor has an emitter coupled to a base of said second emitter follower transistor and said third emitter follower transistor has an emitter coupled to a base of said fourth emitter follower transistor; and
   cascaded fifth and sixth emitter follower transistors and cascaded seventh and eighth emitter follower transistors for developing a complementary differential output, wherein a base of said fifth emitter follower transistor is coupled to said first input terminal and wherein a base of said seventh emitter follower transistor is coupled to said second input terminal, said fifth emitter follower transistor having an emitter coupled to a base of said sixth emitter follower transistor, said seventh emitter follower transistor having an emitter coupled to a base of said eighth emitter follower transistor;

a current mirror stage connected to a collector of said second emitter follower transistor and to a collector of said fourth emitter follower transistor so as to be coupled to receive said differential output of said input stage, and configured to a single-ended output;

a complementary current mirror stage connected to a collector of said sixth emitter follower transistor and to a collector of said eighth emitter follower transistor so as to be coupled to receive said complementary differential output, and configured to produce a single-ended output; and means for commonly coupling said outputs of said current mirror and said complementary current mirror together to produce said single-ended output, wherein an emitter output terminal of said second emitter follower transistor is connected to an emitter output terminal of said sixth emitter follower transistor to form a first node, wherein an emitter output terminal of said fourth emitter follower transistor is connected to an emitter output terminal of said eighth emitter follower transistor to form a second node, said operational amplifier further comprising an impedance element coupled between said first node and said second node, said impedance element developing a current indicative of a potential difference applied between said first input terminal and said second input terminal of said circuit.

2. The operational amplifier circuit of claim 1 further comprising buffer amplifier means for receiving said single-ended output to provide an isolated circuit output.

3. The operational amplifier of claim 1 wherein said input stage and said current mirror stages include constant current elements, the conductivity of which determines the transconductance of said circuit.

4. The operational amplifier of claim 3 wherein said constant current elements are incorporated into a current mirror configuration in which a single constant current element determines the currents flowing in the individual constant current elements whereby said single constant current element determines said transconductance of said circuit.

5. The operational amplifier circuit of claim 4, wherein said circuit is fabricated in integrated circuit chip form and said single constant current element is an off chip element whereby the user of said circuit can program said transconductance.

* * * * *